(12) United States Patent
Jain

(10) Patent No.: US 7,494,905 B2
(45) Date of Patent: Feb. 24, 2009

(54) METHOD FOR PREPARING A SOURCE MATERIAL INCLUDING FORMING A PASTE FOR ION IMPLANTATION

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 381 days.

(21) Appl. No.: 10/920,023

(22) Filed: Aug. 17, 2004

(65) Prior Publication Data

US 2005/0040496 A1 Feb. 24, 2005

Related U.S. Application Data

(60) Provisional application No. 60/496,758, filed on Aug. 21, 2003.

(51) Int. Cl.
*H01L 21/04* (2006.01)
*H01L 21/26* (2006.01)
*H01L 21/42* (2006.01)

(52) U.S. Cl. .................. 438/510; 438/513; 438/514; 438/515

(58) Field of Classification Search .............. 438/513, 438/514, 515
See application file for complete search history.

(56) References Cited

U.S. PATENT DOCUMENTS

| 4,336,205 A | * | 6/1982 | Onishi et al. ............... 558/327 |
| 4,594,182 A | * | 6/1986 | Hashimoto et al. ......... 252/519.3 |
| 4,703,180 A | * | 10/1987 | Taya ........................ 250/425 |
| 5,532,495 A | * | 7/1996 | Bloomquist et al. .... 250/492.21 |
| 6,373,108 B1 | * | 4/2002 | Yamakawa et al. .......... 257/382 |
| 6,458,430 B1 | * | 10/2002 | Bernstein et al. ........... 427/525 |
| 6,921,062 B2 | * | 7/2005 | Gregg et al. ............... 261/23.1 |
| 7,157,848 B2 | * | 1/2007 | Tang et al. ................. 313/495 |

FOREIGN PATENT DOCUMENTS

JP 10199823 * 7/1998

* cited by examiner

*Primary Examiner*—Hsien-ming Lee
(74) *Attorney, Agent, or Firm*—Yingsheng Tung; Wade James Brady, III; Frederick J. Telecky, Jr.

(57) ABSTRACT

The present invention provides, for use in a semiconductor manufacturing process, a method (100) of preparing an ion-implantation source material. The method includes providing (110) a deliquescent ion implantation source material and mixing (110) the deliquescent ion implantation source material with an organic liquid to form a paste.

13 Claims, 3 Drawing Sheets

METHOD FOR PREPARING A SOURCE MATERIAL INCLUDING FORMING A PASTE FOR ION IMPLANTATION

CROSS-REFERENCE TO PROVISIONAL APPLICATION

This application claims the benefit of U.S. Provisional Application No. 60/496,758 entitled "TREATMENT OF SOURCE-FEED MATERIAL FOR ION IMPLANTATION OF INDIUM," to Amitabh Jain, filed on Aug. 21, 2003, which is commonly assigned with the present invention and incorporated herein by reference as if reproduced herein in its entirety.

TECHNICAL FIELD OF THE INVENTION

The present invention is directed in general to the manufacture of semiconductor devices and, more specifically, to the preparation of a source material for ion implantation.

BACKGROUND OF THE INVENTION

As new technologies are implemented to produce smaller semiconductor device components, there is increasing interest in the use of alternative p-type and n-type dopants. For example, antimony and indium are being considered as a replacement for boron at certain stages of device fabrication, such as the construction of the source and drain extensions and halo structures. The implantation of such materials raises a number of process fabrication challenges, however.

For instance, for the implantation of indium, a preferred source material is indium trichloride. Indium trichloride is desirable because it vaporizes at a substantially lower temperature than other potential source materials such as indium oxide, and it does not require a carrier gas. In comparison, when using indium oxide as the source material, an organic carrier gas, such as carbon tetrachloride, is required.

The use of indium trichloride has been problematic however. To provide a constant supply of source material to the arc chamber of an ion implanter device, the source material typically vaporizes in a vaporizing chamber. The vaporizing chamber is initially degassed by applying a vacuum. When using indium trichloride as the source material, it can take several hours to perform this degassing operation. Moreover, it is difficult to maintain a steady low pressure during degassing. Sometimes the vacuum can be lost, requiring the entire process to be restarted. Furthermore, indium trichloride powder is prone to movement within the chamber during degassing. This, in turn, can result in longer chamber cleaning times after ion implantation, as well as the contamination of other components of the ion implanter. Similar problems exist with antimony trichloride.

Therefore, there is a need for an improved source material for ion implantation in semiconductor devices that avoid the above-mentioned limitations.

SUMMARY OF THE INVENTION

To address the above-discussed deficiencies of the prior art, the present invention provides, for use in a semiconductor manufacturing process, a method of preparing an ion-implantation source material. The process includes providing a deliquescent ion implantation source material and mixing the deliquescent ion implantation source material with an organic liquid to form a paste.

Another embodiment is an ion-implantation source material. The ion-implantation source material comprises a paste comprising a mixture of a deliquescent ion implantation source material and an organic liquid. A weight ratio of the organic liquid to the deliquescent source material is between about 1:1 and about 1:100.

Yet another embodiment of the present invention is a method of implanting an ion into a semiconductor substrate. The method includes preparing a paste of an ion-implantation source material as described above. The method further comprises placing the paste in a vaporizing chamber and vaporizing the ion-implantation source material to form implantable ions. The method also includes projected the ions towards a semiconductor substrate.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from an extensive series of investigations that established that the above-described degassing difficulties are due to the use of a deliquescent source material of an ion implantation element. For instance, because indium and antimony trichloride are deliquescent, these salts readily absorb water from air and can become liquid solutions. The use of such deliquescent ion implantation source materials disadvantageously requires long degassing times. In addition, fluctuations in the pressure of the vaporizing chamber during degassing is due to the intermittent vaporization of water associated with such deliquescent source materials.

As part of the investigations of the present invention, it was discovered that mixing the deliquescent source material with an organic liquid to form a paste provides an excellent source material for ion-implantation. While not limiting the scope of the invention by theory, it is thought that water associated with the deliquescent source material is extracted into the organic liquid. When the paste is placed in the vaporizing chamber of an ion implantation device and degassed, the water is rapidly removed along with the organic liquid. Consequently, it is easier to obtain and maintain a constant low pressure in the chamber, and the time required for degassing is substantially reduced. In addition, providing the source material in the form of a paste helps reduce movement of the source material during degassing.

Figure 1:
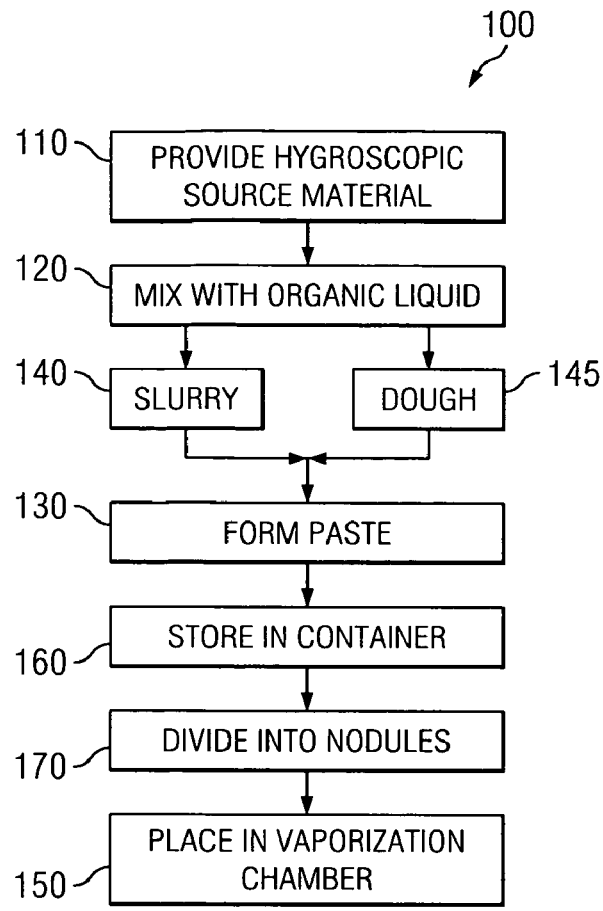
FIG. 1 illustrates, by flow diagram, a method of preparing an ion-implantation source material of the present invention.

One embodiment of the present invention is presented in FIG. 1, which illustrates by flow diagram, an exemplary method 100 of preparing an ion-implantation source material for use in a semiconductor manufacturing process according to the principles of the present invention. A deliquescent source material of an ion implantation element is provided in step 110. Typically the deliquescent source material is provided as a salt in powder form from a commercial source. For the purposes of the present invention, a deliquescent ion implantation source material is defined as any material containing an ion implantable element that readily takes up and retains water. For instance, indium trichloride powder can absorb about 24 percent of its weight in water, thereby forming $InCl_3.4H_2O$. One of ordinary skill in the art would understand that the extent of water absorption would depend upon the type of deliquescent source material as well as the temperature and humidity that the source material is exposed to.

The method 100 further includes a step 120 of mixing the deliquescent source material, provided in step 110, with an organic liquid to form a paste in step 130. The mixing step 120 can be achieved by manually stirring the deliquescent source material and the organic liquid with a rod until a homogenous blend of these two components is obtained. Alternatively, the mixing step 120 could be achieved using mechanical stirrers, blenders or kneaders, or other conventional mixing equipment well known to those skilled in the art.

It is preferable to add enough organic liquid to the deliquescent source material to form a malleable paste. The malleability of the paste can be altered by adjusting the portions of organic liquid and deliquescent source material. In certain preferred embodiments, the weight ratio of organic liquid to deliquescent source material is between about 1:1 and about 1:100, more preferably between 1:4 and about 1:15. As an example, in some embodiments, about 200 to about 500 micro liters of acetone, methanol or ethanol is mixed with about 2 to about 3 grams of indium trichloride. As another example, in some cases, about 2500 micro liters of acetone, methanol or ethanol is mixed with about 8 grams of indium trichloride.

The malleable paste can be configured to have a consistency of a slurry, in step 140, by increasing the proportion of organic ligand to deliquescent source material. The resulting paste can readily flow from a container under the force of gravity or can be sucked into an eye-dropper for subsequent dispensing. Alternatively, the malleable paste can be configured to have a consistency of a dough, in step 145, by decreasing the proportion of organic liquid to deliquescent salt. The resulting paste preferably remains intact when a portion of the paste is picked up on the tip of a rod and held upside-down, but readily released by lightly tapping the rod.

In some cases, it is desirable to use the paste soon after its production, by placing it in the vaporizing chamber of an ion implantation device, in step 150. In other cases, where later use is desired, the paste can be stored in a container, in step 160. Preferably, the container is sealable and composed of a material that does not absorb or allow the source material or the organic liquid to permeate into and escape from the container, thereby keeping the ratio of organic liquid to deliquescent salt constant during storage. In some embodiments, for example, the paste is stored in a sealed plastic tube with a re-sealable opening on one end to facilitate dispensing portions of the paste by squeezing the tube. In other instances, the paste is stored in a glass bottle capped with an eye-dropper that allows the dispensing of portions of the paste by sucking a portion of the paste into the eye-dropper and then expelling that portion.

In another aspect, placing the paste in the vaporizing chamber in step 150 further includes dividing the paste into a plurality of nodules, in step 170. It is thought that dividing the paste into nodules facilitates the rapid degassing of the ion implantation source material and reduces movement of the deliquescent salt during degassing. In some preferred embodiments, the weight percent of each of the nodules comprises from about 1 weight percent to about 5 weight percent of the total amount of the paste.

Yet another embodiment of the present invention is a semiconductor ion-implantation source material. The ion-implantation source material includes a paste comprising a mixture of a deliquescent ion implantation source material and an organic liquid. Any of the above-described embodiments of methods can be used to prepare the ion-implantation source material. A weight ratio of the organic liquid to the deliquescent source material is between about 1:1 and about 1:100. In some preferred embodiments of the malleable paste the ratio is between about 1:4 and about 1:15.

The deliquescent ion implantation source material can include any element that is implantable into a semiconductor substrate in conventional device fabrication protocols. The most commonly implanted species are arsenic, phosphorus, boron, boron difluoride, indium, antimony, germanium, silicon, nitrogen, hydrogen, and helium. In some preferred embodiments, the deliquescent ion implantation source material comprises a salt of a Group 13–15 element (International Union of Pure and Applied Chemist Convention for designating Groups). In other preferred embodiments, the deliquescent ion implantation source material comprises a halide salt, and more preferably, a chloride salt of antimony or indium. In different embodiments, the deliquescent ion implantation source material comprises hafnium chloride or zirconium chloride.

The organic liquid can have a number of advantageous properties to facilitate the extraction of water from the deliquescent source material and its subsequent removal during degassing. It is preferable for the organic liquid to have a low vapor pressure so that it is easily removed during degassing. As an example, the organic liquid can have a vapor pressure that is greater than or equal to the vapor pressure of methanol (e.g., at least about 97 Torr at 20° C.) or of acetone (e.g., at least about 186 Torr at 20° C.). In other preferred embodiments, the organic liquid has a molecular weight of less than 1000 gm/mole, and more preferably less than about 200 gm/mole.

In some cases it is advantageous to use a substantially anhydrous organic liquid for mixing with the deliquescent source material (e.g., $H_2O$ less than 0.1 wt %, and more preferably less than 0.01 wt %) as this minimizes the amount of water that has to be degassed. It is also preferable for the organic liquid to comprise a polar organic liquid, as this will increase the solubility of water in the organic liquid. More preferably, water is miscible with the organic liquid. In some preferred embodiments, the organic liquid comprises an alcohol, such as methanol or ethanol, or a ketone, such as acetone, or combinations thereof.

Figure 2A:
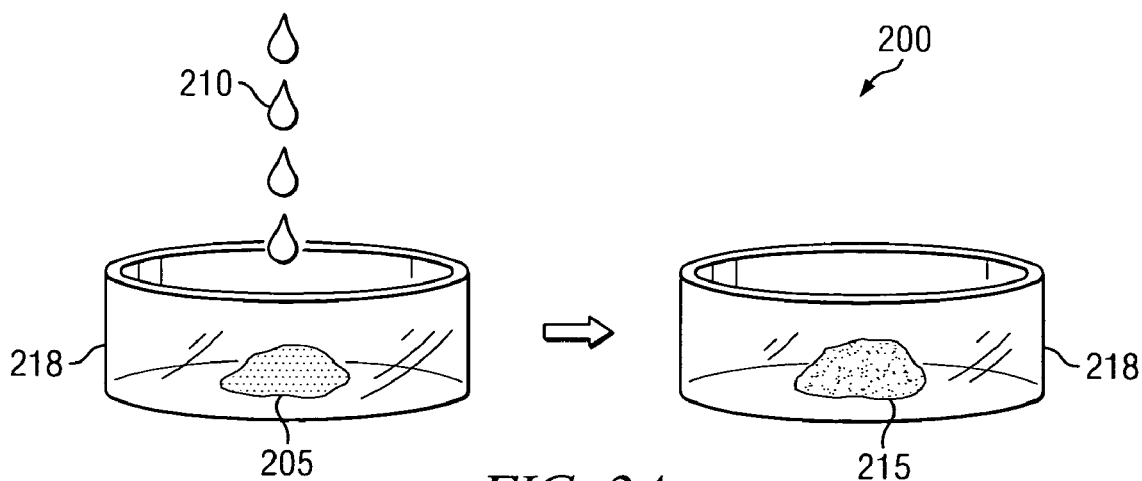
FIGS. 2A–2E illustrate views of selected steps in a method implanting an ion into a semiconductor substrate according to the principles of the present invention.

Still another embodiment of the present invention includes a method of implanting an ion into a semiconductor substrate. FIGS. 2A–2E present selected steps of one embodiment of the method 200 following the principles of the present invention. Turning first to FIG. 2A, illustrated is the preparation of an ion-implantation source material. The preparation includes providing a deliquescent source material 205 of an ion implantation element, such as indium trichloride powder, and mixing it with an organic liquid 210, such as methanol, to form a paste 215. Any of the above-described embodiments of the method of preparing the source material and compositions the source materials can be used. For example, the deliquescent source material 205 can be placed in a petri dish 218 and adding organic liquid 210 drop-wise to the deliquescent source material 205.

Figure 2B:
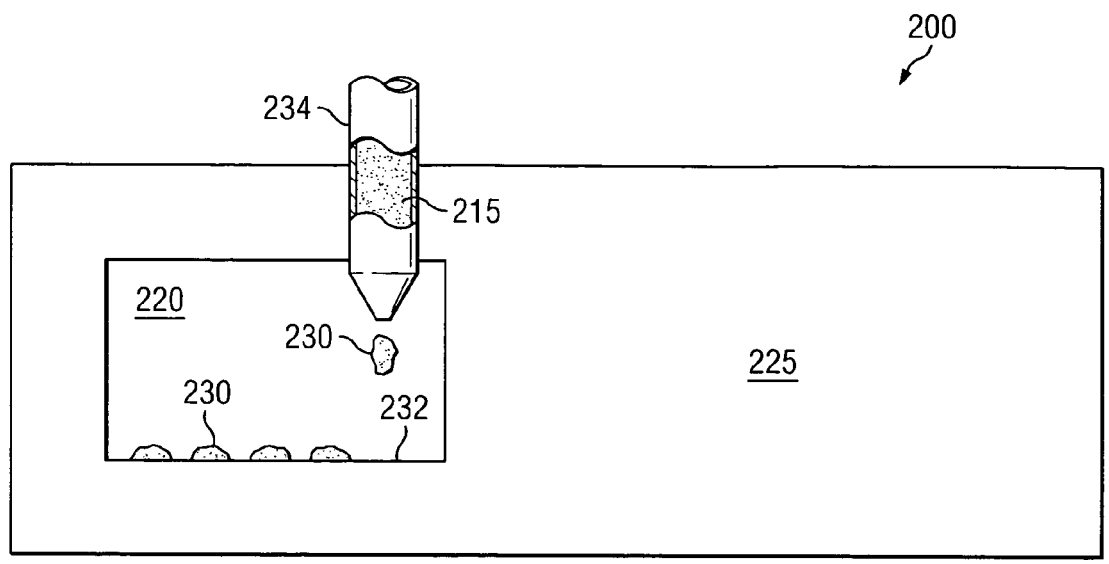

With continuing reference to FIG. 2A, FIG. 2B illustrates placing the paste 215 in a vaporizing chamber 220 of an ion implantation apparatus 225. As illustrated in FIG. 2B, in some preferred embodiments of the method 200, placing the paste 215 includes adapting the paste 215 into one or more nodules 230 and situating the nodules 230 in the vaporizing chamber 220. For example, the paste 215 of about 2–3 grams of indium trichloride and about 300 to about 400 micro liters of methanol, can be divided into a plurality of nodules 230, for example about 5 to about 15 nodules 230, that are uniformly distributed on a floor 232 of the vaporizing chamber 225. In some cases, dividing is facilitated by depositing portions of the paste 215 contained in a squeezable tube 234. In other cases, portions of the paste are scooped up on the end of a rod and then dropped onto the floor by tapping the rod. Of course other means of placing the paste 215 in a vaporizing chamber 220 are also within the scope of the present invention.

Figure 2C:
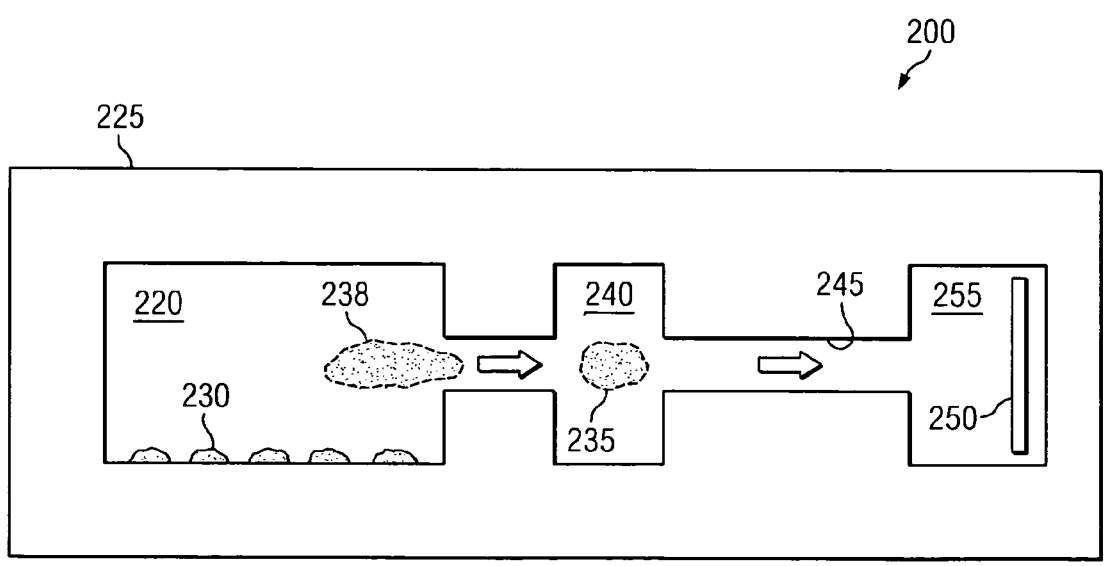

With continuing reference to FIGS. 2A and 2B, FIG. 2C depicts vaporizing the deliquescent source material 205, which in this embodiment of the method 200, are introduced as nodules 230 of the paste 215, to form implantable ions 235. Vaporizing includes subjecting the vaporizing chamber 220 to a low pressure during a degassing period to degas water and the organic liquid from the ion implantation source material 230. One of ordinary skill in the art would be familiar with the types of pressures applied to the vaporization chamber 220 to achieve degassing. During the degassing period substantially all of the organic liquid and water associated with the ion-implantation source material 230 is removed. As discussed above, by providing the source material as a paste 215, and more preferably as nodules 230, the degassing period is shortened by at least about 5 times compared to an analogous degassing period when using an organic liquid-free salt of the ion implantation element. In some embodiments, for example, when using a paste 215 of indium trichloride and methanol that is divided into about 5 to about 15 nodules 230, the degassing period is about 20 minutes. In comparison, when using similar amounts of indium trichloride with no organic liquid added to it, the degassing period is about 2 to 3 hours.

As further illustrated in FIG. 2C, after the degassing period, the vaporization chamber 240 is heated to a temperature sufficient to vaporize the source material in the nodules 230. In some embodiments of the method 200, for example, indium trichloride is heated to a temperature of about 300° C. to about 400° C. The vaporized source material 238 is then transferred to an arc chamber 240 by conventional means. Thereafter, implantable ions 235 are generated in an arc chamber 240, and then transferred to an acceleration tube 245 and projected towards a semiconductor substrate 250 located in a target chamber 255. Of course, any conventional implantation device components and procedures, well known to those skilled in the art, can be used to facilitate the generation and implantation of the ions 235.

Figure 2D:
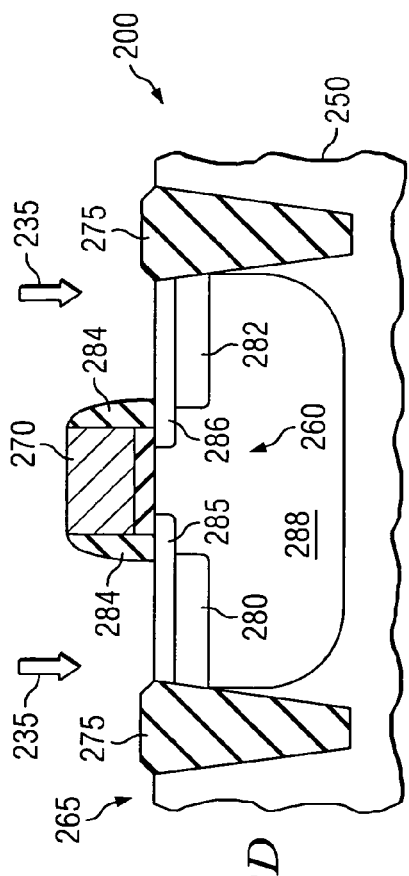

Turning now to FIG. 2D, illustrated is a cross sectional view of the semiconductor substrate 250 during implantation of the ion 235. Embodiments of the method can include the semiconductor substrate 250 comprising any conventional substrate material, such as silicon. The semiconductor substrate 250 can comprise a semiconductor device 260 such as a pMOS or nMOS transistor, or a plurality of such devices 260 in an integrated circuit 265.

FIG. 2D depicts the semiconductor device 260 after forming a gate 270 and shallow trench isolation 275 structures on the substrate 260, using conventional materials, deposition and photolithography techniques. The gate structure 270 and shallow trench isolation structure 275, by acting as masks, can advantageously define portions of the substrate 250 during the implantation with ions 235 to form source and drain, source/drain extensions or halo structures. Of course, additional conventional procedures, such as thermal annealing, can be performed to complete the formation of the source/drain structure 280, 282. Similarly, other transistor components, such as sidewall spacers 284, source drain extensions 285, 286 and well 288, can be fabricated using conventional processes to complete the formation of the semiconductor device 260.

Figure 2E:
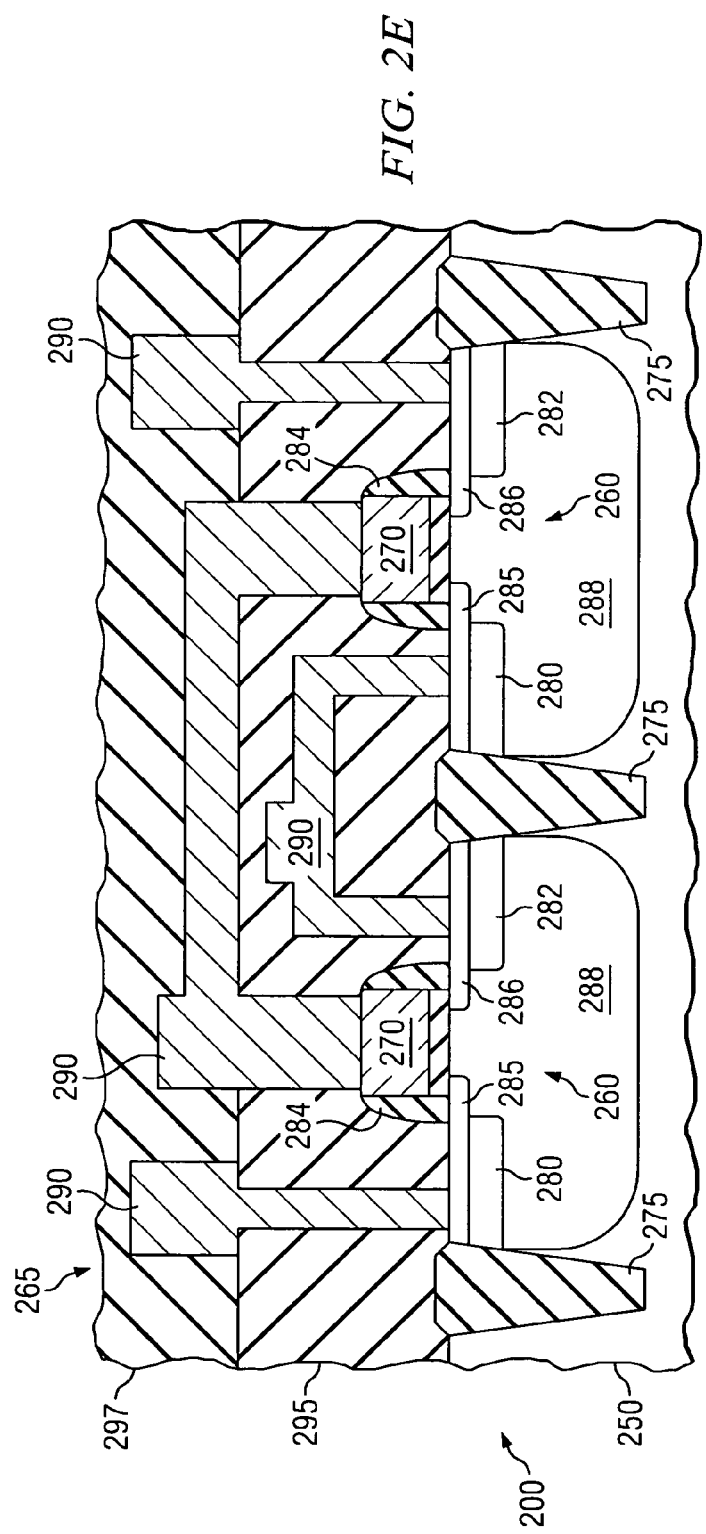

Referring now to FIG. 2E, illustrated is the integrated circuit 265 after interconnecting metal lines 290 on one of more insulating layers 295, 297 located over the MOS transistors 260 and interconnecting the MOS transistors 260 to form an operative integrated circuit 265.

Although the present invention has been described in detail, one of ordinary skill in the art should understand that they can make various changes, substitutions and alterations herein without departing from the scope of the invention.

What is claimed is:

1. A method of implanting an ion into a semiconductor substrate, comprising:
   preparing an ion-implantation source material, comprising:
      providing a deliquescent source material of an ion implantation element; and
      mixing said deliquescent source material with an organic liquid to form a paste;
   adapting said paste into a nodule and situating said nodule in a vaporizing chamber;
   vaporizing said paste to form implantable ions; and
   implanting said ions into a semiconductor substrate.

2. The method as recited in claim 1, wherein said vaporizing includes subjecting said vaporizing chamber to a pressure during a degassing period wherein substantially all of said organic liquid and water associated with said ion-implantation source material is removed from said vaporizing chamber.

3. The method as recited in claim 2, wherein said degassing period is at least 5 times shorter than an analogous degassing period when using an organic liquid-free salt of said ion implantation element.

4. The method as recited in claim 1, wherein said implanting further includes forming a source and drain structure in said semiconductor substrate to form a semiconductor device in an integrated circuit.

5. A method of implanting an ion into a semiconductor substrate, comprising:
   adapting a mixture of a deliquescent source material of an ion implantation element and an organic liquid into nodules, and situating said nodules in a vaporizing chamber;
   vaporizing said paste to form implantable ions; and
   implanting said ions into a semiconductor substrate.

6. The method as recited in claim 5, wherein said vaporizing includes subjecting said vaporizing chamber to a low pressure during a degassing period wherein substantially all of said organic liquid and water associated with said ion-implantation source material is removed from said vaporizing chamber.

7. The method as recited in claim 6, wherein said degassing period is at least 5 times shorter than an analogous degassing period when using an organic liquid-free salt of said ion implantation element.

8. The method as recited in claim 5, wherein said implanting further includes forming a source and drain structure in said semiconductor substrate to form a semiconductor device in an integrated circuit.

9. The method as recited in claim 5, wherein said mixture further includes said organic liquid to said deliquescent ion implantation source material in a weight ratio of between about 1:1 and about 1:100.

10. The method as recited in claim 5, wherein a weight percent of each of each of said nodules comprises for about 1 weight percent to about 5 weight percent of said mixture.

11. The method as recited in claim 5, wherein said deliquescent source material is indium trichloride or antimony trichloride.

12. The method as recited in claim 5, wherein said organic liquid has a molecular weight of less than 1000 gm/mole and is miscible with water.

13. The method as recited in claim 5, wherein said organic liquid is methanol, ethanol, acetone or a combination thereof.

* * * * *